(12) United States Patent
Fraas

(10) Patent No.: US 7,994,417 B1
(45) Date of Patent: Aug. 9, 2011

(54) OPTIMAL CELL SELECTION FOR SERIES CONNECTION IN CASSEGRAIN PV MODULE

(75) Inventor: Lewis M. Fraas, Issaquah, WA (US)

(73) Assignee: JX Crystals Inc., Issaquah, WA (US)

( * ) Notice: Subject to any disclaimer, the term of this patent is extended or adjusted under 35 U.S.C. 154(b) by 554 days.

(21) Appl. No.: 11/710,040

(22) Filed: Feb. 23, 2007

Related U.S. Application Data

(60) Provisional application No. 60/775,715, filed on Feb. 23, 2006.

(51) Int. Cl.
H01L 31/0232 (2006.01)

(52) U.S. Cl. .................... 136/244; 136/249; 136/246

(58) Field of Classification Search ........... 136/252–265
See application file for complete search history.

(56) References Cited

U.S. PATENT DOCUMENTS

| | | | |
|---|---|---|---|
| 3,229,682 A | 1/1966 | Perlmutter et al. | 126/698 |
| 3,232,795 A | 2/1966 | Gillette et al. | 136/246 |
| 3,433,676 A | 3/1969 | Stein | |
| 3,751,303 A | 8/1973 | Kittl | |
| 3,912,540 A | 10/1975 | Broder | 136/256 |
| 3,923,381 A | 12/1975 | Winston | 359/852 |
| 3,929,510 A | 12/1975 | Kittl | |
| 4,017,758 A | 4/1977 | Almer et al. | |
| 4,045,246 A | 8/1977 | Mlavsky et al. | 136/246 |
| 4,069,812 A | 1/1978 | O'Neill | |
| 4,131,485 A | 12/1978 | Meinel et al. | |
| 4,180,414 A | 12/1979 | Diamond et al. | |
| 4,234,352 A | 11/1980 | Swanson | |
| 4,239,555 A | 12/1980 | Scharlack et al. | 136/251 |
| 4,331,829 A | 5/1982 | Palazzetti et al. | |
| 4,388,481 A | 6/1983 | Uroshevich | 136/246 |
| 4,658,086 A * | 4/1987 | McLeod et al. | 136/249 |
| 4,707,560 A | 11/1987 | Hottel et al. | |
| 4,746,370 A | 5/1988 | Woolf | |
| 4,776,895 A | 10/1988 | Goldstein | |
| 4,906,178 A | 3/1990 | Goldstein et al. | |
| 4,976,606 A | 12/1990 | Nelson | |

(Continued)

FOREIGN PATENT DOCUMENTS

JP 63-316486 12/1988

OTHER PUBLICATIONS

Howe et al; *The characteristics of atmospheric-type burners when used with natural gas*; Proc. of Semi-annual Meeting of ASME; Jul. 10, 1939; pp. 673-677.

(Continued)

*Primary Examiner* — Jennifer K. Michener
*Assistant Examiner* — Jayne Mershon
(74) *Attorney, Agent, or Firm* — James Creighton Wray

(57) ABSTRACT

A solar PV panel has an array of primary mirrors that collects and reflects solar radiation toward an array of dichroic secondary elements. The dichroic secondary elements reflect near-visible solar radiation to an array of near-visible radiation sensitive solar cells and simultaneously transmit infrared radiation to an array of infrared sensitive solar cells. The array of near-visible radiation sensitive cells and the array of infrared sensitive cells are wired in series. The optical properties of the dichoic secondary element, near-visible radiation sensitive cell, and IR sensitive cell are chosen for simultaneous maximum power production from the panel.

19 Claims, 8 Drawing Sheets

U.S. PATENT DOCUMENTS

| | | | |
|---|---|---|---|
| 5,044,939 A | 9/1991 | Dehlsen | |
| 5,080,724 A | 1/1992 | Chubb | |
| 5,091,018 A | 2/1992 | Fraas et al. | |
| 5,096,505 A | 3/1992 | Fraas et al. | |
| 5,118,361 A | 6/1992 | Fraas et al. | |
| 5,123,968 A | 6/1992 | Fraas et al. | |
| 5,217,539 A | 6/1993 | Fraas et al. | |
| 5,248,346 A | 9/1993 | Fraas et al. | |
| 5,255,666 A | 10/1993 | Curchod | |
| 5,312,521 A | 5/1994 | Fraas et al. | |
| 5,344,497 A | 9/1994 | Fraas et al. | |
| 5,356,487 A | 10/1994 | Goldstein et al. | |
| 5,383,976 A | 1/1995 | Fraas et al. | |
| 5,389,158 A | 2/1995 | Fraas et al. | |
| 5,401,329 A | 3/1995 | Fraas et al. | 136/253 |
| 5,403,405 A | 4/1995 | Fraas et al. | |
| 5,438,584 A * | 8/1995 | Paoli et al. | 372/45.01 |
| 5,439,532 A | 8/1995 | Fraas | |
| 5,505,789 A | 4/1996 | Fraas et al. | |
| 5,512,109 A | 4/1996 | Fraas et al. | |
| 5,551,992 A | 9/1996 | Fraas | |
| 5,560,783 A | 10/1996 | Hamlen | |
| 5,601,661 A | 2/1997 | Milstein et al. | |
| 5,616,186 A | 4/1997 | Fraas et al. | |
| 5,651,838 A | 7/1997 | Fraas et al. | |
| 5,865,906 A | 2/1999 | Ferguson et al. | |
| 5,942,047 A | 8/1999 | Fraas et al. | |
| 6,037,536 A | 3/2000 | Fraas | |
| 6,091,017 A | 7/2000 | Stern | 136/246 |
| 6,091,018 A | 7/2000 | Fraas et al. | |
| 6,177,628 B1 | 1/2001 | Fraas et al. | |
| 6,198,038 B1 | 3/2001 | Shukla et al. | |
| 6,218,607 B1 | 4/2001 | Mulligan et al. | |
| 6,232,545 B1 | 5/2001 | Samaras et al. | |
| 6,235,983 B1 | 5/2001 | Becker et al. | |
| 6,271,461 B1 | 8/2001 | Fraas et al. | |
| 6,291,761 B1 | 9/2001 | Takada et al. | 136/244 |
| 6,528,716 B2 | 3/2003 | Collette et al. | 136/246 |
| 2005/0051205 A1* | 3/2005 | Mook, Jr. | 136/255 |
| 2005/0158942 A1* | 7/2005 | Welser et al. | 438/235 |
| 2007/0137695 A1* | 6/2007 | Fetzer et al. | 136/255 |
| 2008/0000516 A1* | 1/2008 | Shifman | 136/246 |

OTHER PUBLICATIONS

Kittl et al.; *Design analysis of TPV-generator system*; Proceedings of 25th Annual Meeting of Power Sources Conference; May 1972; pp. 106-110.

Tester et al.; *Comparative performance characteristics of cylindrical, parabolic, and flat plate solar energy colectors*; Presentation at annual winter meeting of ASME, Nov. 17-22, 1974; 12 pages.

Fraas et al.; *Concentrated and piped sunlight for indoor illumination*; Applied Optics, vol. 2, No. 4; Feb. 15, 1983; pp. 578-582.

Höffler et al.; *Selective emitters for thermophotovoltaic solar energy conversion*; Solar Cells, vol. 10; 1983; pp. 257-271.

Lampert, Carl M.; *Heat mirror coatings for energy conserving windows*; Solar Energy Materials; vol. 6; 1981; pp. 1-41.

Höfler et al.; *Interference filters for thermophotovoltaic solar energy conversion*; Solar Cells, vol. 10; 1983; pp. 273-286.

Höfler et al.; *Selective absorbers and interference filters for thermophotovoltaic energy conversion*; Proceedings of 5th Photovoltaic Energy Conference, Athens, Greece; Oct. 1983; pp. 225-229.

O'Neill, Mark J.; *Development of a Fresnel lens gallium arsenide photovoltaic concentrator for space applications*; Final Technical Report NASA Contract NAS3-24871; Sep. 1986.

Pelka et al.; *Natural gas fired thermophotovoltaic system*; Proceedings of the 32nd International Power Sources Conference, Cherry Hill, NJ; Jun. 1986; pp. 110-123.

Woolf, L. D.; *Optimum efficiency of single and multiple bandgap cells in thermophotovoltaic energy conversion*; Solar Cells, vol. 19; 1986-1987; pp. 19-31.

Todorof, Bill; *A 450 suns concentrator module design*; Conference Record, 20th IEEE Photovoltaic Specialists conference, Las Vegas, NV; Sep. 1988; pp. 1347-1352.

Morgan et al.; *Radioisotope thermalphotovoltaic application of the GaSb solar cell*; Proceedings of NASA Sprat Conference, Cleveland, OH; Nov. 7-9, 1989; pp. 349-358.

Chubb, Donald L.; *Reappraisal of solid selective emitters*; Proceedings of 21st IEEE Photovoltaic Specialists Conference, Kissimmee, FL; May 1990; pp. 1326-1333.

Day et al.; *Application of the GaSb solar cell in isotope-heated power systems*; Proceedings of 21st IEEE Photovoltaic Specialists Conference, Kissimmee, FL; May 1990; pp. 1320-1325.

Piszczor et al.; *The mini-dome fresnel lens photovoltaic concentrator array: current status of component & prototype panel testing*; Proceedings of 21st IEEE Photovoltaic Specialists Conference, Kissimmee, FL; May 1990; pp. 1271-1276.

Kuryla et al.; *22.7% efficient 1000X GaAs concentrator module*; Proceedings of 21st IEEE Photovoltaic Specialists Conference, Kissimmee, FL; May 1990; pp. 1142-1146.

Fraas et al.; *Over 30% efficient tandem Gallium solar cells for use with concentrated sunlight*; Optoelectronics, vol. 5, No. 2; Dec. 1990; pp. 297-310.

Doellner, Oscar L.; *Aircraft photovoltaic power-generating system*; Appendix A of Doctoral dissertation, Univ. of Arizona; 1991; p. 154.

Fraas et al.; *Advanced photovoltaic power systems using tandem GaAs/GaSb concentrator modules*; Proceedings of 3rd Annual Symp. of univ. Ariz/NASA Space Eng. Res. Center for Utilization of Local Planetary Resources; F1b. 20-22, 1992; pp. II-9-II-21.

Fraas, Lewis M.; *JX Crystals Inc.Presentation to NREL Enterprise Growth Forum*; Oct. 25, 1995; pp. 1-18.

Whitaker, Tim; *GaSb shines brighter than midnight sun*; Tech. Update: Fall 1998.

\* cited by examiner

OPTIMAL CELL SELECTION FOR SERIES CONNECTION IN CASSEGRAIN PV MODULE

This application claims the benefit of U.S. Provisional Application No. 60/775,715 filed Feb. 23, 2006, which is hereby incorporated by reference in its entirety.

BACKGROUND OF THE INVENTION

Various types of multijunction solar cells have now been demonstrated with energy conversion efficiencies over 35%. Several prior art configurations are shown in FIGS. 1, 2, 3, and 4.

FIG. 1 shows GaAs light sensitive cells and GaSb IR sensitive cells mechanically-stacked in a triplet circuit in a voltage-matched configuration in a concentrator module with Fresnel lenses focusing the solar energy onto the cells. This is a cell configuration with 2 junctions in 2 different materials. A lens parquet 1 overlays a circuit 7 on a heat spreading back plate, on which top light sensitive cells 3 and bottom IR sensitive cells 5 are placed.

FIG. 2 shows a 2-junction monolithic InGaP/GaInAs cell mechanically-stacked on a separate GaSb cell. There are 3 junctions in 3 different materials. No circuit wiring is suggested for this ease. A prismatic cover with double AR coatings 9 cover the InGaP/GaInAs cell and a prismatic cover with single AR coating 15 covers the GaSb cell. Double AR coatings 11 and isolation 13 separate the two cells.

FIG. 3 shows a Cassegrain module with voltage-matched InGaP/GaAs 21 and GaSb 19 cells. This Cassegrainian PV module concept uses a dichroic hyperbolic secondary mirror to split the incoming light 17 spectrum into short and long wavelength bands to create two focal points. There are 3 junctions in 3 separate materials. The module is 33% efficient.

FIG. 4 shows a very popular InGaP/GaInAs/Ge monolithic 3-junction cell that has been developed for light-weight for satellite power systems with positive contact 23 and negative contact 25.

It is very desirable to integrate these high efficiency multijuction cell concepts with optics where the circuits are simple to fabricate and the resultant solar panels are inexpensive and produce maximum power with maximum energy conversion efficiency. However, problems with the prior art configurations have prevented such a product from being realized.

In the mechanically stacked configurations shown in FIGS. 1 & 2, the metal grids on the top and the bottom of the top cell produce shading losses for the IR bottom cell. Furthermore the top cell substrate can absorb substantial IR energy before it arrives at the IR cell for conversion. These reflection and absorption losses decrease the energy conversion efficiency. Furthermore, the grid on the back of the top cell adds complexity and cost.

Another problem for the configurations shown in FIGS. 1 and 3 as described in the prior art is a problem with high currents in the voltage-matched configuration. For example if in the FIG. 1 case, the GaAs cells each produce 10 Amps and the GaSb circuit produces 8 Amps, the voltage matched triplet will produce 38 Amps at 1 Volt.

There are also several problems with the InGaP/GaInAs/Ge monolithic cell shown in FIG. 4 when it is brought down from space for terrestrial applications. While it is light-weight for space, this is not important for terrestrial applications. There are really three problems that relate to the germanium cell.

The first problem with the germanium cell is that it produces excess current that can not be used. FIG. 5 shows the current available from the terrestrial spectrum as a function of the longest wavelength that a given semiconductor can receive. It follows from this curve that the most current available to an InGaP cell lattice matched to germanium will be about 17.5 mA/cm2 with a similar amount of current available to a lattice matched GaInAs cell. Meanwhile, the current available to the germanium cell is much larger at about 28 mA/cm2. Because of the monolithic series connection in this cell, the excess germanium cell current is wasted resulting in a lower than optimal conversion efficiency.

The second problem with the germanium cell is a lower than optimal voltage. Given the terrestrial spectrum, the bandgap of germanium is just too low. While it can theoretically absorb out to 1.9 microns, there are just no photons in the terrestrial spectrum beyond about 1.8 microns.

The third problem with germanium is that its open circuit voltage in practice is just not as good as it should be theoretically. FIG. 6 shows the open circuit voltage of materials having a variety of bandgaps, compared to the radiative limit. A Ge cell has a voltage of only 0.2 V whereas a GaSb cell (not shown) can produce 0.5 V.

Needs exist for improved simple solar concentrator panels with series connected cells with different compositions with all cells operating at their maximum power such that said panel operates at its maximum efficiency.

SUMMARY OF THE INVENTION

A new solar PV panel has an array of primary mirrors that collect and reflect solar radiation toward an array of dichroic secondary elements. The dichroic secondary elements reflect near-visible solar radiation to an array of near-visible radiation sensitive solar cells and simultaneously transmit infrared radiation to an array of infrared sensitive solar cells. The array of near-visible radiation sensitive cells and the array of infrared sensitive cells are all wired in series. The optical properties of the dichoic secondary element and the near-visible radiation sensitive cell and the IR sensitive cell ensure simultaneous maximum power production from the panel.

In a preferred embodiment, the infrared sensitive cell is a GaSb cell and the near-visible radiation sensitive cell is a $GaAs_{1-x}P_x$ cell and the dichroic secondary element transition wavelength is chosen to fall at the $GaAs_{1-x}P_x$ cell bandedge. The phosphorus content, x, in the $GaAs_{1-x}P_x$ cell falls between 1% and 9%, nominally 5%, and the dichroic filter transition wavelength is at approximately 0.8 microns.

In another embodiment, the infrared sensitive cell is a GaSb cell and the near visible radiation sensitive cell is an $In_{1-z}Ga_zP/Ga_{1-y}In_yAs$ dual junction cell and the dichroic secondary element transition wavelength is chosen to fall at the $Ga_{1-y}In_yAs$ cell band edge. The Indium content, y, in the $In_{1-z}Ga_zP/Ga_{1-y}In_yAs$ dual junction cell falls between 5% and 15%, nominally 10%, the gallium content, z, falls between 35% and 45%, nominally 40%, and the dichroic filter transition wavelength is at approximately 1 microns.

In a preferred embodiment, a GaSb cell is the infrared sensitive cell and its short circuit current is greater than that for the chosen near-visible light sensitive cell so that as the two cell arrays are series connected, all cells operate simultaneously at their individual maximum power points.

light to the near-visible light sensitive cell 49 from the light source and dichroic secondary mirror 43. The near-visible light sensitive cell is mounted on a back mounting plate 51 and has a heat sink 53.

Figure 9:
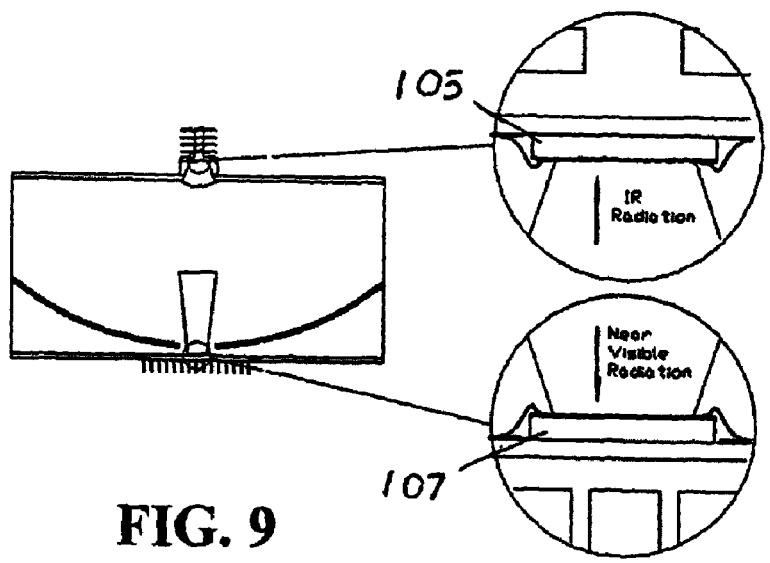
FIG. 9 is a close-up diagram of the cells in the Cassegrain PV module of FIG. 8.

FIG. 9 highlights the two cells, IR cell 105 and near-visible cell 107, whose compositions need to be optimized for operation together at their respective maximum power points when connected in series. A key feature of this invention is to specify the cell compositions required for maximum panel efficiency. These required compositions are derived by reference to FIG. 5. The resultant compositions are summarized in Table 1 below for two panel embodiments. A first simpler panel embodiment uses 2 junctions in two different materials and a second more efficient panel embodiment uses 3 junctions in three different materials. The table shows cells and performance predictions for series connected 2J and 3J configurations.

| Cell Composition | Current Partition | AM1.5 1sun Theory Jsc (mA/cm2) | Cut-on Wavelength (microns) | Eg (eV) | Voc (V) | Practical Jsc (mA/cm2) | Practical FF | Practical Target Efficiency |
|---|---|---|---|---|---|---|---|---|
| Series 2J Panel | | | | | | | | |
| GaAs(0.95)P(0.05) | 45% | 27.9 | 0.82 | 1.5 | 1.2 | 23.8 | 0.85 | 24.3% |
| GaSb | 55% | 34.1 | 1.77 | 0.7 | 0.5 | 29.1 | 0.8 | 11.5% |
| | | | | | | | | 35.8% |
| Series 3J Panel | | | | | | | | |
| In(0.6)Ga(0.4)P | 30% | 18.6 | 0.73 | 1.7 | 1.4 | 15.9 | 0.88 | 19.6% |
| Ga(0.9)In(0.1)As | 30% | 18.6 | 0.99 | 1.25 | 0.95 | 15.9 | 0.85 | 12.8% |
| GaSb | 40% | 24.8 | 1.77 | 0.7 | 0.5 | 21.2 | 0.8 | 8.5% |
| | | | | | | | | 40.9% |

Figure 10:
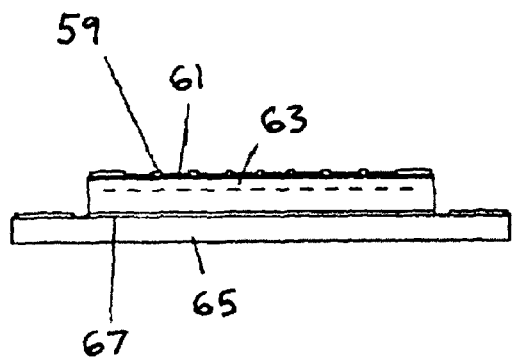

FIG. 10 is a diagram of a GaSb IR cell formed by diffusion.

Figure 11:
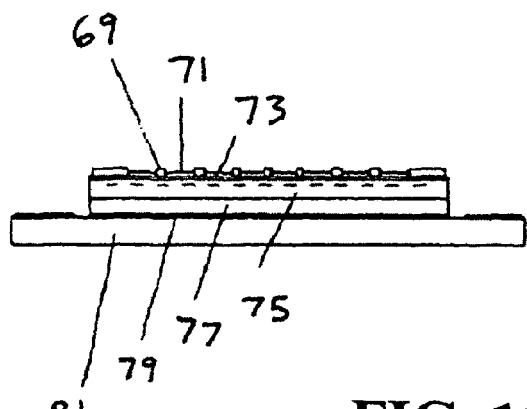

FIG. 11 is a diagram of a GaSb IR cell formed by epitaxy.

Figure 12:
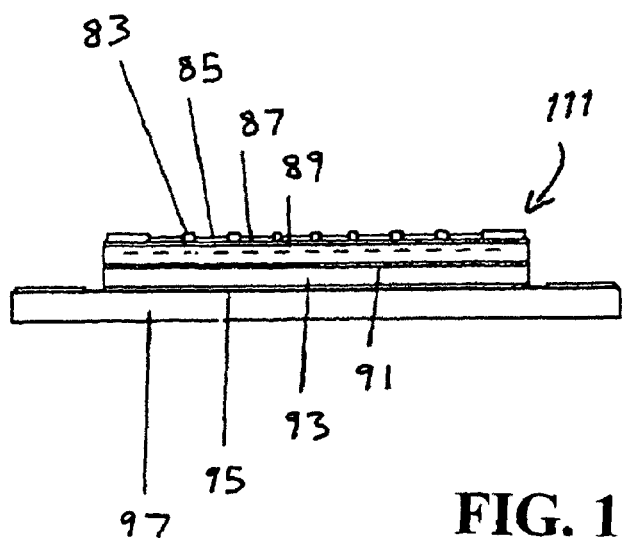

FIG. 12 is a diagram of a GaAs light sensitive cell with phosphorus for connecting with a GaSb IR cell.

Figure 13:
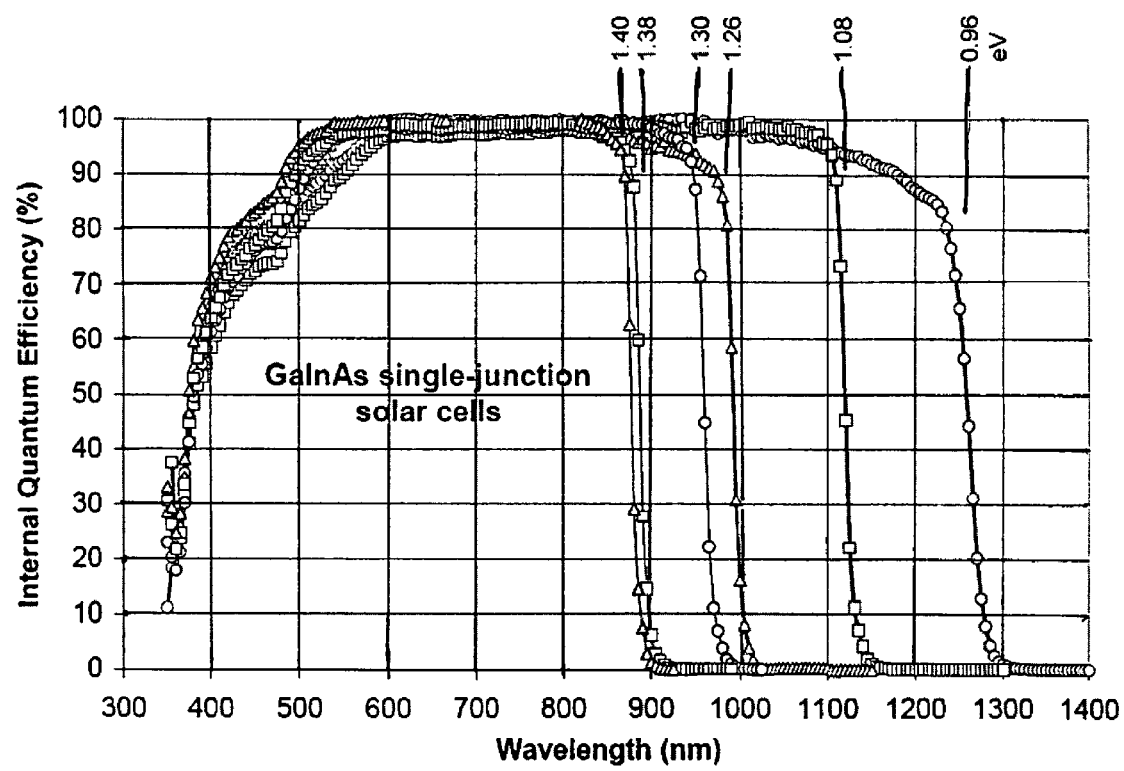

FIG. 13 is a plot of internal quantum efficiency versus wavelength for GaInAs single-junction solar cells with various bandgaps.

Figure 14:
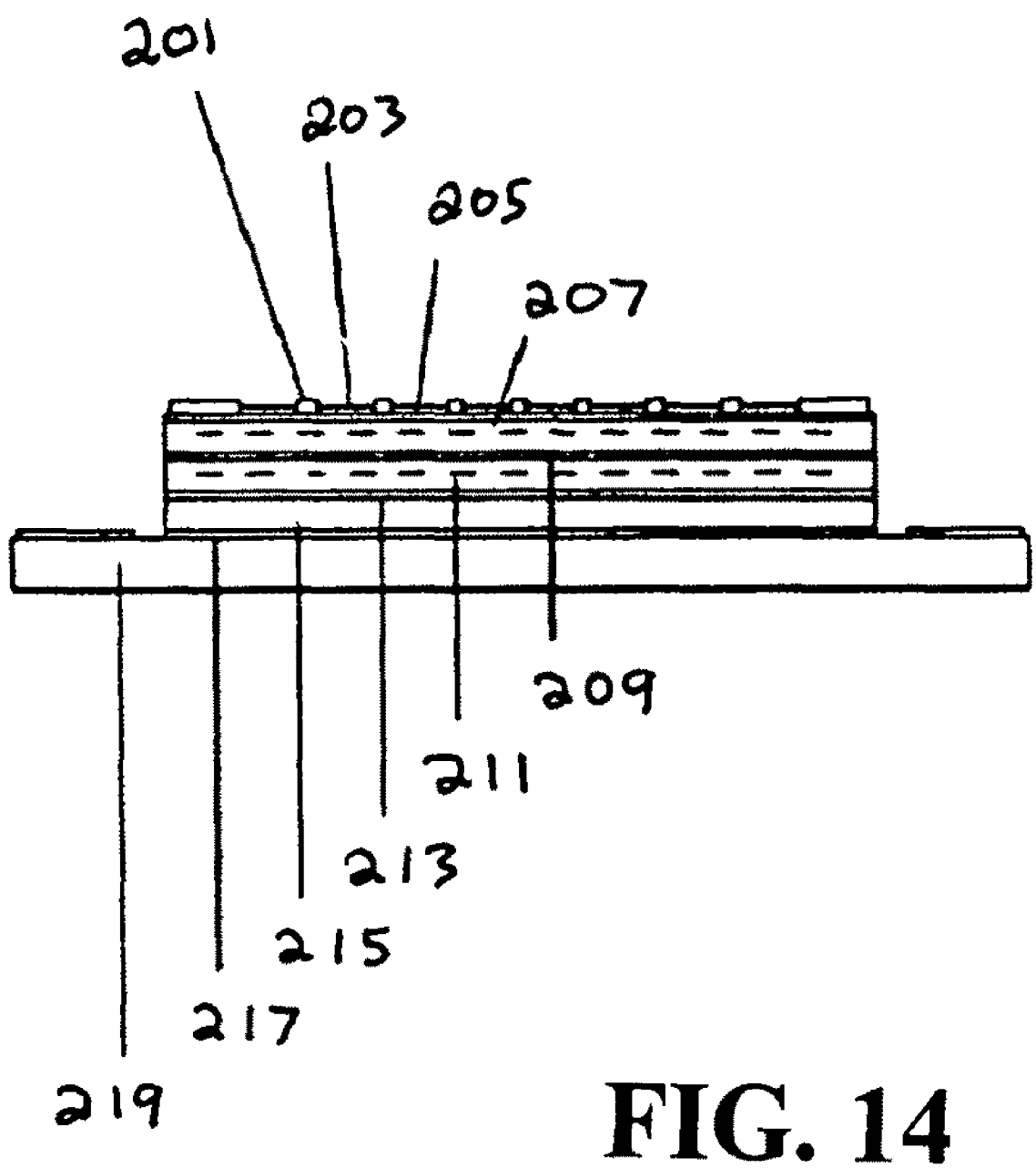

FIG. 14 is a diagram of a monolithic InGaP/GaInAs dual junction light sensitive cell.

DETAILED DESCRIPTION OF THE PREFERRED EMBODIMENTS

Figure 7:
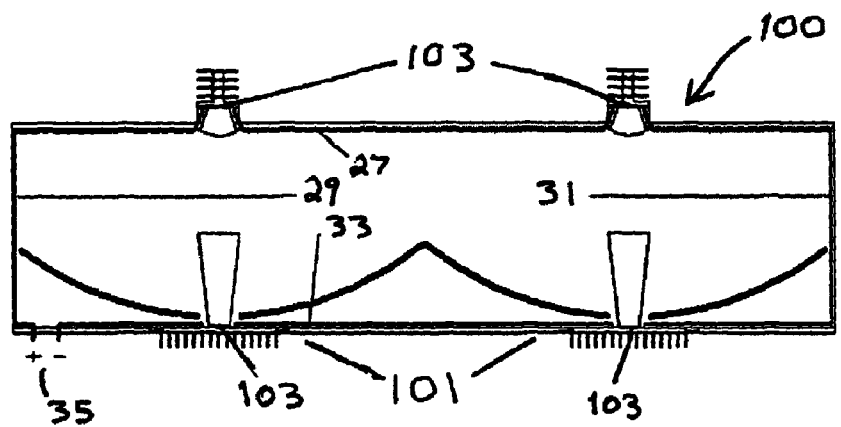
FIG. 7 is a diagram of a concentrator panel with series connected IR and light sensitive cell strings.
Figure 8:
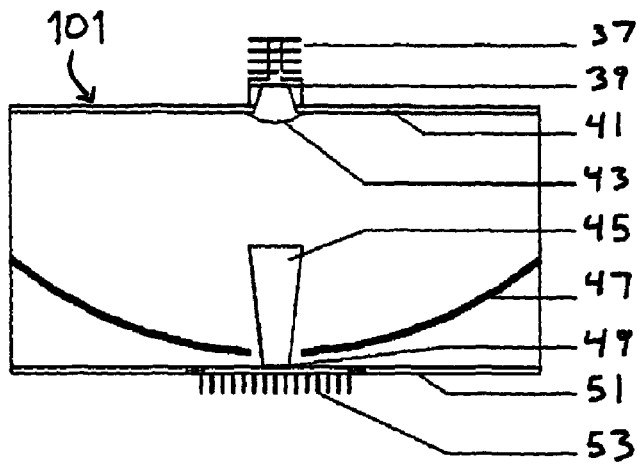
FIG. 8 is a diagram of a Cassegrain PV module and key components.

FIG. 7 illustrates a Cassegrain concentrator PV panel with series connected IR and light sensitive cell strings. The panel 100 in this invention consists of any number of Cassegrainian modules 101 where all cells 103 in the panel are series connected and the cell compositions are chosen such that all of the different cells operate at their maximum power points. Wire series 27 connects the IR cells, wire series 29 and 31 connect the IR cell string and light sensitive cell string, and wire series 33 connects the light sensitive cells. Wire series 29 and 33 connect to the panel electric power terminals 35. FIGS. 8 and 9 show the details of the Cassegrainian modules 101 making up the panel 100.

FIG. 8 shows the key components in a Cassegrainian PV module 101. Infrared radiation is conveyed to the IR cell 39 by the primary mirror 47 through the dichroic secondary cold mirror 43, set in glass window 41. The IR cell is backed by an IR cell heat sink 37. A homogenizer 45 conveys near-visible The cell compositions were selected such that all cells operate at their maximum power points when series connected. When different cells are operated in series, they will all operate at the same current. As a first approximation, this means that each cell of each different composition should be operated at its maximum power current. However, variations in humidity will result in variations in the amount of IR arriving at the IR cell. To allow for this, the compositions of the different cells are chosen such that the IR cell operates with a small amount of excess current.

A GaSb cell is used as the IR cell because it is simple to make and has a bandgap at the right energy to absorb all of the photons available out to 1.8 microns. Beyond 1.8 microns, water vapor absorption eliminates IR photons leading to the plateau at 62 mA/cm2 in FIG. 5. Given the choice of GaSb as the IR material, the cells can be made either by diffusion or by epitaxy.

FIGS. 10 and 11 show GaSb IR cell configurations made by diffusion and by epitaxy, respectively. In FIG. 10, a top metal grid 59 and AR coating 61 are layered on a GaSb diffused junction cell 63 with a back metal contact 67 on an alumina circuit plate 65. In FIG. 11, a top metal grid 69 and AR coating 71 over an AlGaSb window layer 73 cover GaSb P & N epitaxy layers 75 on a GaSb crystal substrate 77 with a back metal contact 79 mounted on an alumina circuit plate 81.

Figure 1:
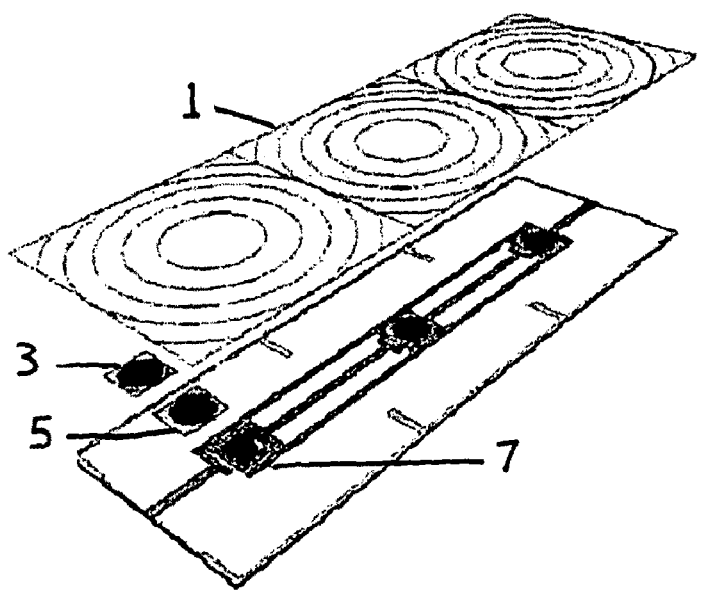
FIG. 1 is a diagram of a prior art concentrator module with GaAs light sensitive cells stacked on GaSb IR sensitive cells in triplet voltage matched configuration.
Figure 2:
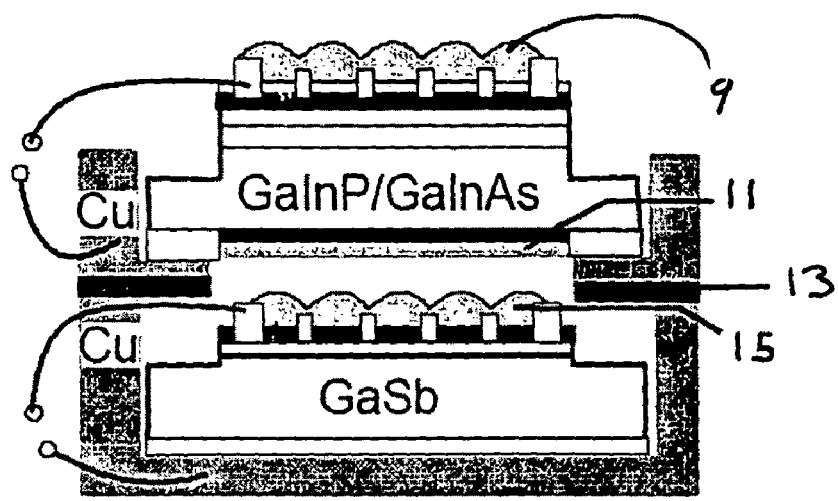
FIG. 2 is a diagram of a prior art GaInP/GaInAs—GaSb mechanical stack cell configuration.
Figure 3:
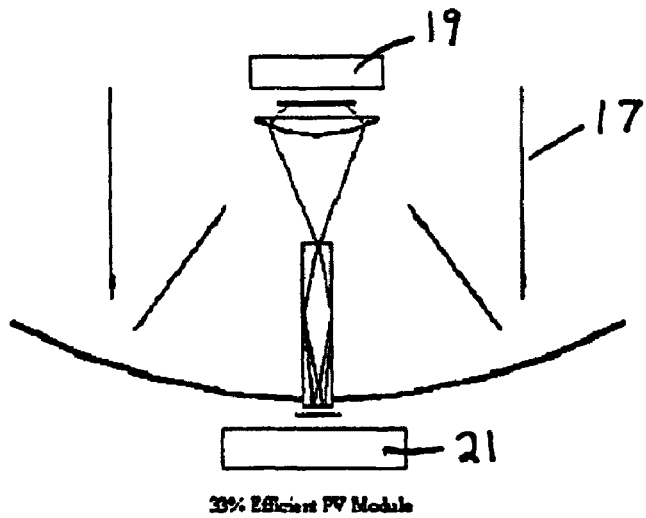
FIG. 3 is a diagram of a prior art Cassegrain module with voltage-matched InGaP/GaAs—GaSb cells.
Figure 4:
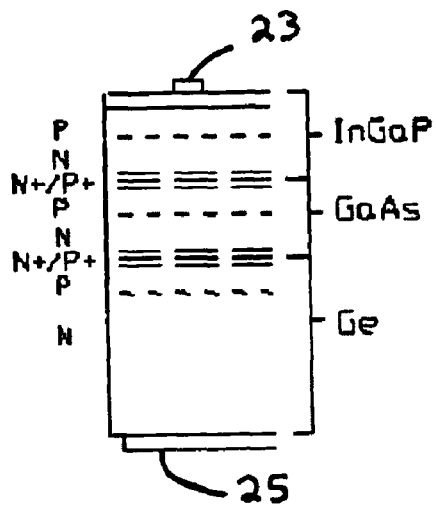
FIG. 4 is a diagram of a prior art series connected monolithic triple junction cell.
Figure 5:
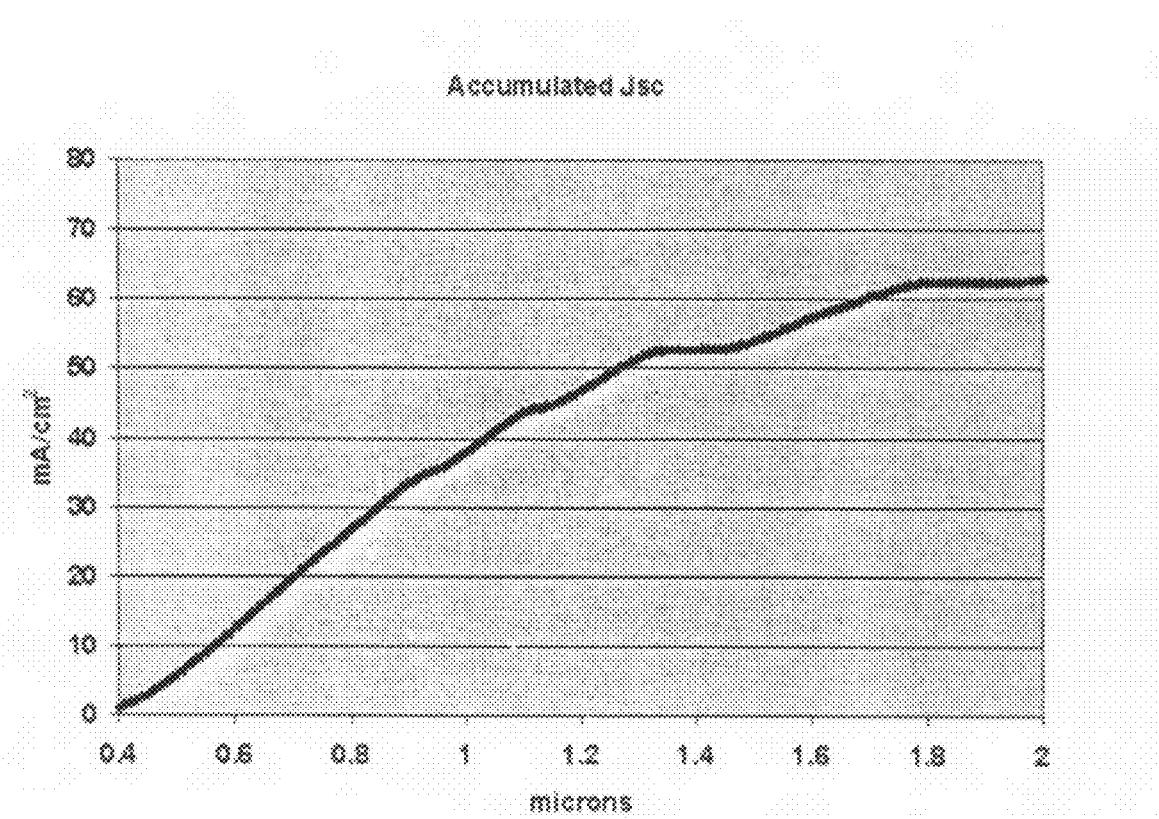
FIG. 5 is a graph showing the current available from the terrestrial spectrum as a function of the longest wavelength that a given semiconductor can absorb.
Figure 6:
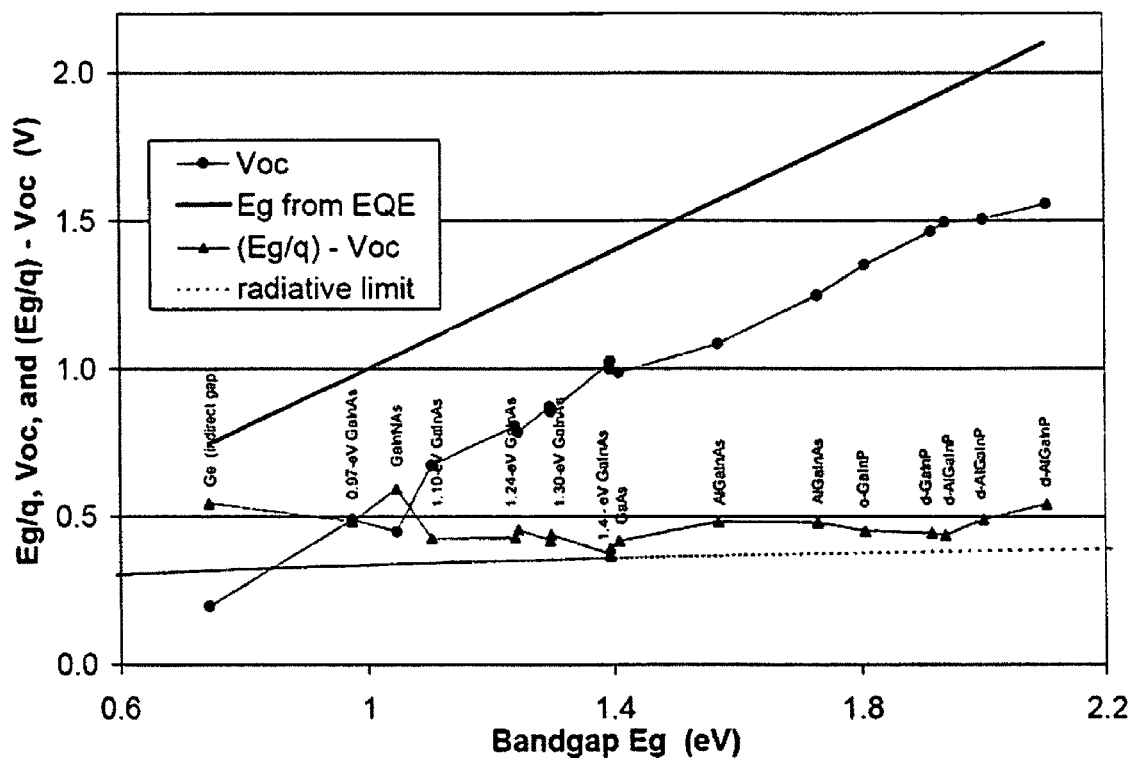
FIG. 6 is a graph showing the open circuit voltage of materials having a variety of bandgaps, compared to the radiative limit.

The simple GaAs cell from FIG. 1 is not optimal for the top cell in a 2 junction panel as its available 1-sun short circuit current is too high at 34 mA/cm2 leaving only 28 mA/cm2 for the GaSb cell, as can be seen in FIG. 5. If GaAs and GaSb cells were wired in series, the GaSb cell would limit the current for the two cells and the resultant circuit would operate at a much lower efficiency than the sum efficiency possible if the two cells were operated independently. The solution to this problem is to add a small amount of phosphorus (P) to the GaAs to form GaAs(1−x)P(x), raising the near-visible light sensitive cell's'bandgap. The P content is approximately 5% with an x>0 and <10%.

FIG. 12 shows the resultant $GaAs_{1-x}P_x$ cell 111 for connection with a GaSb IR cell. Such a combination yields maximum power and efficiency of operation. A top metal grid 83 and AR coating 85 on AlInP window layer 87 cover $GaAs_{0.95}P_{0.05}$ P & N epitaxy layers 89 over transition layer 91 on GaAs crystal substrate 93 with back metal contact 95 against alumina circuit plate 97.

As can be seen from Table 1, the $GaAs_{0.95}P_{0.05}$ cell's bandgap corresponds to a threshold wavelength for absorption at, approximately 0.82 microns, decreasing its potential short circuit current to approximately 28 mA/cm2. The transition wavelength below which the dichroic filter reflects and above which it transmits is chosen to be at approximately a corresponding 0.82 microns, resulting in the short circuit current available to the GaSb IR cell increasing to approximately 34 mA/cm2. Because the fill factor for a low bandgap cell is always less than for a high bandgap cell and there must be an allowance for a margin in humidity variations, these compositions allow both $GaAs_{0.95}P_{0.05}$ and GaSb cells to operate simultaneously at near their respective maximum power points, maximizing the power output and efficiency for the panel. The amount of phosphorus addition is sufficient to match cell maximum power points but is small enough to keep crystal lattice constants similar enough to maintain good crystal quality in the $GaAs_{0.95}P_{0.05}$ cell.

As shown in table 1, this combination of cells should allow a combined series-circuit solar energy conversion efficiency of over 35%.

A second panel embodiment has 3 different junctions with three different cell materials series connected. The three appropriate cell materials used in the panel of this invention are also described in table 1. An $In_{1-z}Ga_zP/Ga_{1-y}In_yAs$ dual junction cell is used as the near visible radiation sensitive cell.

For this second panel embodiment, the material compositions must again be adjusted such that all 3 junctions operate simultaneously at their maximum power points when all junctions are series connected. A 62 mA/cm2 current is available out to the band edge of a GaSb cell. Rather than dividing this current by three for the three junctions, 40% is allocated to the GaSb low band gap cell to give it more short circuit current, with 30% to each of the $In_{1-z}Ga_zP$ and $Ga_{1-y}In_yAs$ junction materials. Given that the band gap of $Ga_{1-y}In_yAs$ can be adjusted downward with more indium content as shown in FIG. 13, an appropriate indium content y is selected from the nature of terrestrial sunlight given in FIG. 5. Good quality $Ga_{1-y}In_yAs$ cells can now be made.

As shown in table 1, the indium content, y, is selected to be about 10% or in the range between 5% and 15%. The gallium content, z, in the $In_{1-z}Ga_zP$ is selected to be about 40% or between 35% and 45%, such that the crystal lattices of $In_{1-z}Ga_zP$ and $Ga_{1-y}In_yAs$ match.

FIG. 14 shows the monolithic dual junction cell to be used in series with GaSb cells in this second embodiment, high efficiency Cassegrain panel. Top metal grid 201 and AR coating 203 on AlInP window layer 205 cover a sandwich of $In_{0.6}Ga_{0.4}P$ P & N epitaxy layers 207, $Ga_{0.9}In_{0.1}As$ P & N epitaxy layers 211, and GaAs crystal substrate 215 separated by P+ and N+ tunnel junction 209 and transition layers 213 on back metal plate 217 against alumina circuit plate 219.

Referring to Table 1, the dichroic filter transmission to reflection transition wavelength is 0.99 microns (approximately 1 micron) so that wavelengths shorter than 1 micron are reflected to the $In_{0.6}Ga_{0.4}P/Ga_{0.9}In_{0.1}As$ cell and wavelengths longer than 1 micron are transmitted to the IR GaSb cell.

As table 1 shows, these material choices allow all 3 junctions to be operated simultaneously at their maximum power and efficiency points, yielding a combined practical solar conversion efficiency over 40%.

The panel embodiments described in this invention have several advantages over prior art solar panels. Referring specifically to the series connected $In_{0.6}Ga_{0.4}P/Ga_{0.9}In_{0.1}As$—GaSb Cassegrain panel cell group in comparison to the Monolithic $In_{0.5}Ga_{0.5}P/GaAs/Ge$ series connected cell, the GaSb cell beats the Ge cell with a better voltage by 0.3 V. The theoretical limit efficiency for the InGaP/GaInAs—GaSb combination is 59.5% with a 40% practical module efficiency possible, both values again substantially better than for the prior art.

An additional advantage for the InGaP/GaInAs—GaSb combination in the Cassegrainian configuration is the division of the solar radiation heat load into two separate locations with a very manageable heat load at the IR cell location. This will result in lower cell operating temperatures and still higher practical panel efficiency relative to a panel with a monolithic InGaP/GaInAs/Ge cell.

I claim:

1. A solar PV panel comprising a plurality of series connected modules comprising an array of series-connected primary mirrors collecting and reflecting solar radiation toward an array of series-connected dichroic secondary elements and within each module each of said dichroic secondary elements reflecting near-visible solar radiation to an array of series-connected near-visible radiation sensitive solar cells and simultaneously transmitting infrared radiation to an array of series-connected infrared sensitive solar cells, wherein each radiation sensitive cell of the array of near-visible radiation sensitive cells and each infrared sensitive cell of the array of infrared sensitive cells are wired in series, and wherein the optical properties of each of the dichroic secondary elements and the near-visible radiation sensitive cells and the IR sensitive cells is configured for simultaneous maximum power production from the panel, wherein the array of series-connected near-visible radiation sensitive solar cells is connected in series with the array of series-connected infrared sensitive solar cells.

2. The panel of claim 1, wherein each infrared sensitive cell is a GaSb cell and each near-visible radiation sensitive cell is a $GaAs_{1-x}P_x$ cell comprising a Phosphorus content x.

3. The panel of claim 2, wherein the Phosphorus content, x, in the $GaAs_{1-x}P_x$ cell is between 1% and 9%.

4. The panel of claim 1, wherein the infrared sensitive cell is a GaSb cell and the near visible radiation sensitive cell is an $In_{1-z}Ga_zP/Ga_{1-y}In_yAs$ dual junction cell having an Indium content y and a Gallium content z.

5. The panel of claim 4, wherein the Indium content, y, in the $In_{1-z}Ga_zP/Ga_{1-y}In_yAs$ dual junction cell is between 5% and 15%.

6. The panel of claim 1, wherein a GaSb cell is the infrared sensitive cell having a short circuit current greater than that for the chosen near-visible light sensitive cell so that as the two cell arrays are series connected, all cells operate simultaneously at their individual maximum power points.

7. The panel of claim 2, wherein transition wavelengths of each of the dichroic secondary elements falls at a bandedge of the $GaAs_{1-x}P_x$ cell.

8. The panel of claim 3, wherein the Phosphorus content, x, in the $GaAs_{1-x}P_x$ cell is about 5%.

9. The panel of claim 3, wherein transition wavelengths of each of the dichroic secondary elements is approximately 0.8 microns.

10. The panel of claim 3, wherein transition wavelengths of each of the dichroic secondary elements falls at a bandedge of the $GaAs_{1-x}P_x$ cell.

11. The panel of claim 4, wherein transition wavelengths of each of the dichroic secondary elements falls at a bandedge of the $Ga_{1-y}In_yAs$ cell.

12. The panel of claim 5, wherein the Indium content y in the $In_{1-z}Ga_zP/Ga_{1-y}In_yAs$ dual junction cell is about 10%.

13. The panel of claim 4, wherein the Gallium content z is between 35% and 45%.

14. The panel of claim 13, wherein the Gallium content z is about 40%.

15. The panel of claim 5, wherein transition wavelengths of each of the dichroic secondary elements is approximately 1 microns.

16. The solar PV panel of claim 1, wherein each series-connected module comprises a series-connected cassegrainian module.

17. The solar PV panel of claim 16, wherein each series-connected cassegrainian module comprises a series-connected primary minor and a dichroic secondary reflector.

18. The solar PV panel of claim 17, wherein each dichroic secondary reflector reflects the near visible solar radiation to a series-connected near visible solar radiation sensitive solar cell.

19. The solar PV panel of claim 17, wherein each dichroic secondary reflector transmits the infrared radiation to a series-connected infrared radiation sensitive solar cell.

* * * * *